United States Patent
Matsui (10) Patent No.: US 12,432,820 B2
(45) Date of Patent: Sep. 30, 2025

(54) HEATER AND PRODUCTION THEREOF

(71) Applicant: Momentive Technologies Japan K.K., Tokyo (JP)

(72) Inventor: Yoshihiko Matsui, Sayo-gun Hyogo (JP)

(73) Assignee: Momentive Technologies Japan K.K., Tokyo (JP)

( * ) Notice: Subject to any disclaimer, the term of this patent is extended or adjusted under 35 U.S.C. 154(b) by 0 days.

(21) Appl. No.: 18/598,430

(22) Filed: Mar. 7, 2024

(65) Prior Publication Data

US 2024/0215116 A1 Jun. 27, 2024

Related U.S. Application Data (63) Continuation of application No. 16/754,026, filed as application No. PCT/JP2018/036650 on Oct. 1, 2018, now abandoned.

(30) Foreign Application Priority Data

Oct. 30, 2017 (JP) .................................. 2017-209520

(51) Int. Cl.
*H05B 3/06* (2006.01)
*H01L 21/67* (2006.01)
(Continued)

(52) U.S. Cl.
CPC ........... *H05B 3/06* (2013.01); *H01L 21/6833* (2013.01); *H05B 3/10* (2013.01); *H05B 3/74* (2013.01);
(Continued)

(58) Field of Classification Search
None
See application file for complete search history.

(56) References Cited

U.S. PATENT DOCUMENTS 6,242,719 B1 * 6/2001 Kano ................ H01L 21/67103
219/541
9,351,344 B2 5/2016 Kano
(Continued)

FOREIGN PATENT DOCUMENTS

EP 1758436 A1 2/2007
JP H09102665 A * 4/1997
(Continued)

OTHER PUBLICATIONS

JP H09102665 A (Mori, Hiroyuki) Apr. 15, 1997 [retrieved on Dec. 30, 2024]. Retrieved from Foreign Image and Text database, translation by Clarivate Analytics. (Year: 1997).*
(Continued)

*Primary Examiner* — Edward F Landrum
*Assistant Examiner* — Theodore J Evangelista
(74) *Attorney, Agent, or Firm* — Tutunjian & Bitetto, P.C.

(57) ABSTRACT

Provided is a heater in which heater patterns are provided in parallel between terminals. Each terminal is divided into a divided terminal having electrical conduction only with one heater pattern, and a divided terminal having electrical conduction only with the other heater pattern. After a heater body is fabricated, in a state prior to mounting a feed bolt, resistance adjustment is performed with respect to each of a virtual series path formed between the divided terminals and a virtual series path formed between the divided terminals. Then the feed bolt is mounted to each divided terminal, whereby a plurality of virtual series heater patterns are placed in electrical conduction with each other, thus forming a parallel circuit.

9 Claims, 7 Drawing Sheets

(51) Int. Cl.
  *H01L 21/683* (2006.01)
  *H05B 3/10* (2006.01)
  *H05B 3/14* (2006.01)
  *H05B 3/74* (2006.01)

(52) U.S. Cl.
  CPC ........ *H01L 21/67103* (2013.01); *H05B 3/143* (2013.01); *H05B 2203/002* (2013.01); *H05B 2203/017* (2013.01)

(56) References Cited

U.S. PATENT DOCUMENTS

| | | | |
|---|---|---|---|
| 10,679,873 B2 | 6/2020 | Kitabayashi | H01L 21/67103 |
| 2004/0188413 A1 | 9/2004 | Natsuhara et al. | |
| 2005/0014031 A1 | 1/2005 | Hiramatsu et al. | |
| 2005/0252903 A1 | 11/2005 | Maki | H01L 21/67103 219/270 |
| 2008/0029195 A1 | 2/2008 | Lu | |
| 2012/0318785 A1 | 12/2012 | Kushihashi et al. | |
| 2014/0263281 A1 | 9/2014 | Kano | |

FOREIGN PATENT DOCUMENTS

| | | |
|---|---|---|
| JP | 10233436 | 9/1998 |
| JP | H11317284 A | 11/1999 |
| JP | 11354260 | 12/1999 |
| JP | 2004087476 | 3/2004 |
| JP | 2004087476 A | 3/2004 |
| WO | 0243441 A1 | 5/2002 |

OTHER PUBLICATIONS

List of Patents or Patent Applications Treated as Related dated Mar. 7, 2024, 11 pgs.
International Search Report from PCT/JP2018/036650 dated Nov. 13, 2018, 2 pgs.

\* cited by examiner

HEATER AND PRODUCTION THEREOF

CROSS REFERENCE TO RELATED APPLICATIONS

This application is a continuation of co-pending U.S. patent application Ser. No. 16/754,026 filed on Apr. 6, 2020, which is the U.S. National Stage of PCT/JP2018/036650 filed on Oct. 1, 2018.

FIELD OF THE INVENTION

The present invention relates to a heater that is suitably used as a heater for heating a wafer in a semiconductor manufacturing process, and its production.

BACKGROUND

Heaters such as ceramic heaters have been widely used as heaters for heating wafer in manufacturing process of semiconductor and liquid crystal. One heater design has been known (in Patent Document 1, for example), in which a heater element made from conductive material such as PG (pyrolytic graphite) is formed on a base between terminals in a predetermined heater pattern of helical, spiral or meandering shape, for example.

Such heater includes a serial-type heater 10 (FIG. 7) in which a heating zone 11 is formed between terminals A and B in series and a conventional parallel-type heater 20 (FIG. 8) in which first and second heating zones 21 and 22, respectively, are formed respectively between terminals A and B in parallel, either one of which may be selected to perform an optimal heating performance depending upon shape or outer diameter of a work to be heated, purpose of use of a device to which the heater is incorporated, power source to be applied, for example. The heating zone 11 in the serial-type heater 10 of FIG. 7 and the first and second heating zones 21, 22 in the conventional parallel-type heater 20 of FIG. 8 are shown as simplified patterns by way of examples, respectively.

When a work such as a semiconductor wafer is heated by a heater, there would be a tendency in most applications that the outer peripheral area has a temperature lower than the inner peripheral area. Accordingly, a heater is usually designed such that the outer peripheral area is given a lower electric resistance and the inner peripheral area is given a higher electric resistance in order that the outer and inner peripheral areas should be heated substantially uniformly. Alternatively, it may be required in some cases to heat different areas such as outer and inner peripheral areas, upper and lower areas, right-side and left-side areas to different temperatures. To satisfy the requirements in the respective designs, it is necessary to give a specific electric resistance property to the respective heating zones.

Figure 7:
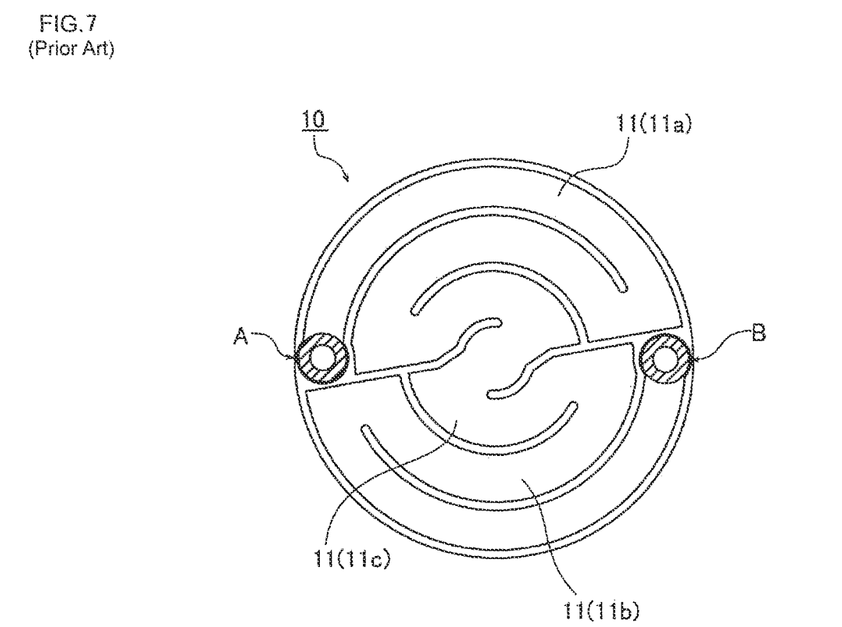
FIG. 7 is an overall plan view of a serial-type heater according to the prior art.
Figure 8:
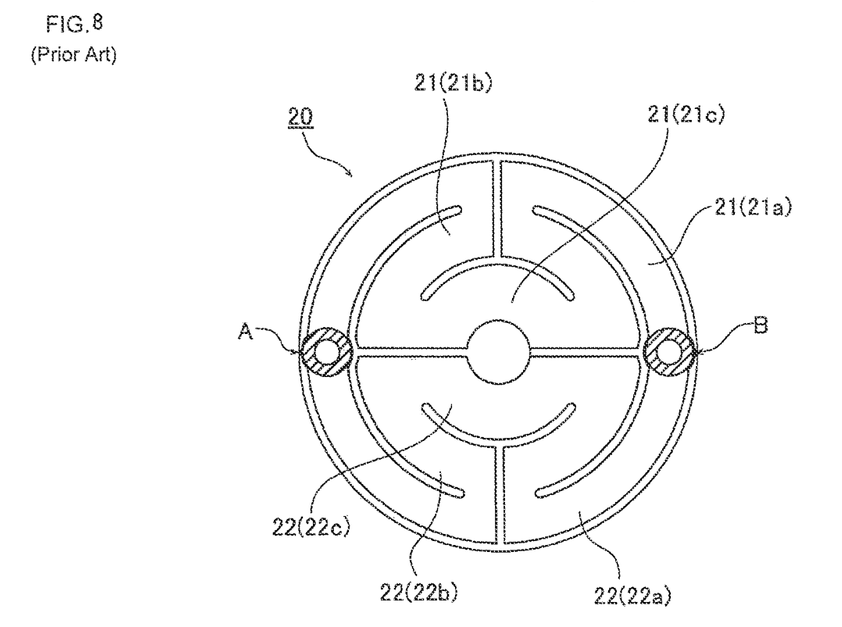
FIG. 8 is an overall plan view of a conventional parallel-type heater.
Figure 9:
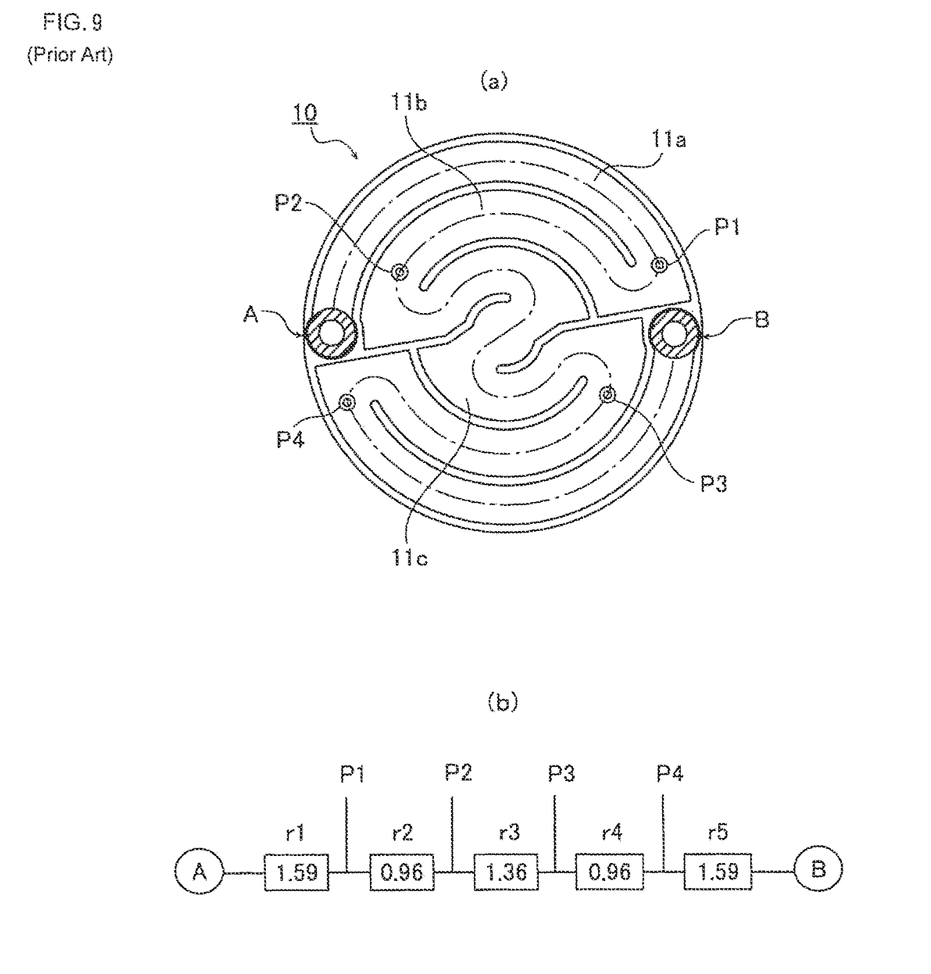
FIG. 9(a) is an overall plan view showing the serial-type heater of FIG. 7 in which resistance measurement points are plotted.
FIG. 9(b) is an explanatory view showing the manner of resistance adjustment for this heater.

For example, the heating zone 11 of the serial-type heater 10 shown in FIG. 7 comprises, in a radial direction, an outer peripheral section 11a, an intermediate section 11b and an inner peripheral section 11c in each semicircle. An example of adjustment for giving optimal resistances to the respective sections for uniform heating will be described in reference to FIG. 9. Measurement points P1 to P4 are plotted for measuring resistance values at the respective sections. In this case, a section from the terminal A to the measurement point P1 (the outer peripheral section 11a) should have a resistance value r1=1.59 ohms, a section from the measurement point P1 to the measurement point P2 (the intermediate section 11b) should have a resistance value r2=0.96 ohms, a section from the measurement point P2 to the measurement point P3 (inner peripheral section 11c) should have a resistance value r3=1.36 ohms, a section from the measurement point P3 to the measurement point P4 (the intermediate section 11b) should have a resistance value r4=0.96 ohms and a section from the measurement point P4 to the terminal B should have a resistance value r5=1.59 ohms (each sectional resistance value r1 to r5 is a reference value after being adjusted).

With regard to the heating zone 11 of the serial-type heater 10, it is possible to measure and adjust the resistance values sequentially from the terminal A, the measurement points P1 to P4 and to the terminal B. More specifically, the resistance value from the terminal A to each measurement points (including the terminal B) is exactly the same with the total sum of the sectional resistance values for the sections therebetween (for example, the resistance value from the terminal A to P4 should be identical to r1+r2+r3=3.91 ohms). Accordingly, the resistance adjustment is performed relatively easily in such manner that, after measuring the resistance values between the terminal A and the measurement points P1 to P4 and the measurement points B in the order, each measured resistance value should be adjusted to become equal to the total sum of the preceding sectional resistance values. In practice, the element of the heating zone 11 is formed at first a little bit thicker to provide a resistance value of a little bit smaller than the design resistance value, which should then be partly scraped depending upon the resistance values measured at the respective measurement points for the resistance adjustment.

However, with the conventional parallel-type heater 20 (FIG. 8) in which the first and second heating zones 21, 22 are formed in each semicircles between the terminals A and B, the resistance values measured at the respective measurement points in the first and second heating zones 21, 22 have two different current routs, one starting from the terminal A to the measurement point (A-Pn) and the other starting from the measurement point to the terminal A (Pn-A). Accordingly, when a man tries to adjust the resistance value by scraping the element in a measured section, this will influence and change the resistance values in other sections. The resistance adjustment should be carried out taking such influence into consideration, which should require a great deal of skill.

Figure 10:
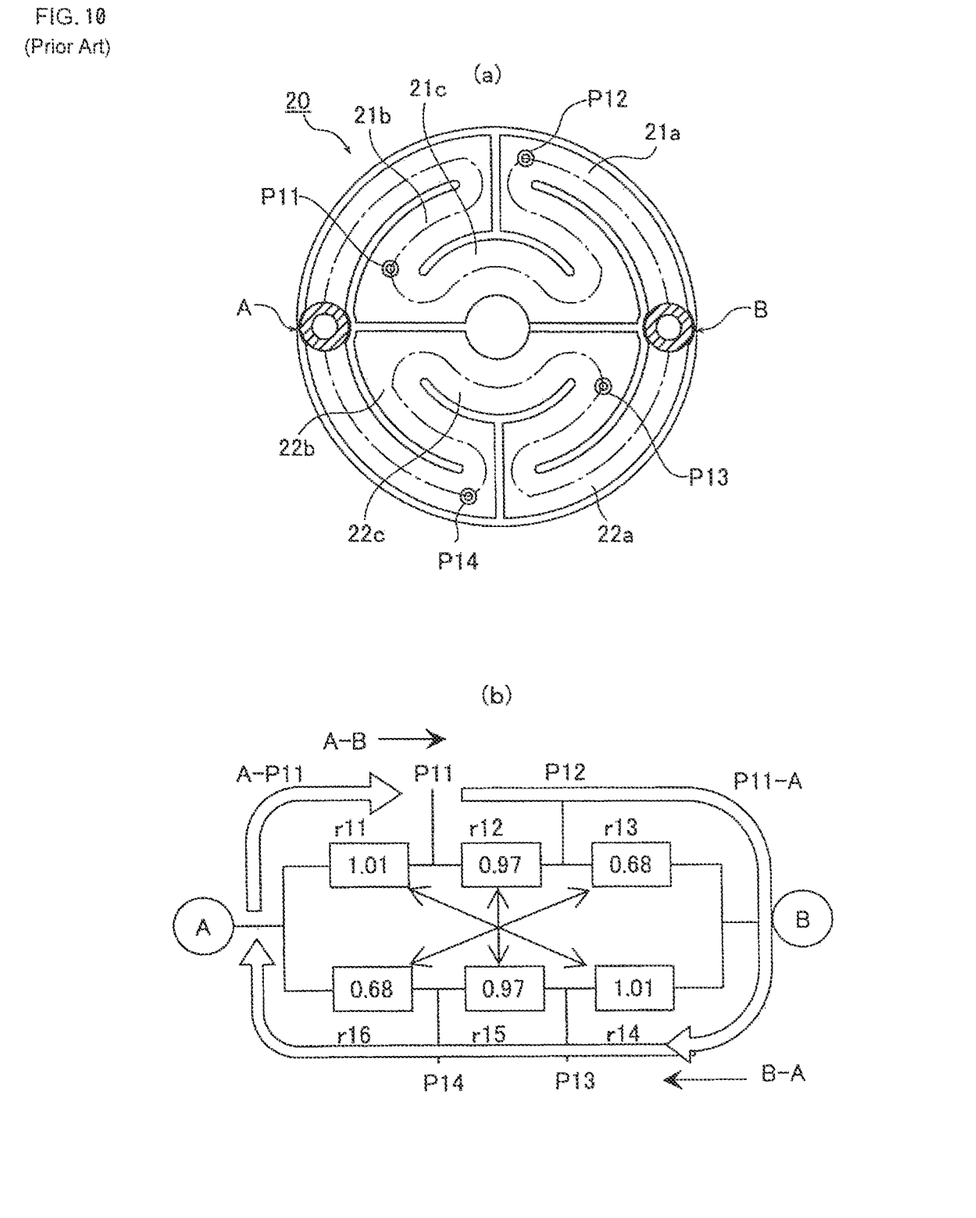
FIG. 10(a) is an overall plan view showing the conventional parallel-type heater of FIG. 8 in which resistance measurement points are plotted.
FIG. 10(b) is an explanatory view showing the manner of resistance adjustment for this heater.

This will be described in more detail in reference to FIG. 10. The design resistance value of the heater 20 is determined to be 1.6 ohms, and measurement points P11 to P14 are allotted in the first and second heating zones 21, 22 between the terminals A and B. In this case, a section between the terminal A and the measurement point P11 (the outer peripheral section 21a and the intermediate section 21b of the heater pattern 21) should have a resistance value r11=1.01 ohms, a section between the measurement points P11 and P12 (the inner peripheral section 21c and the intermediate section 21b of the first heating zone 21) should have a resistance value r12=0.97 ohms, a section between the measurement point P12 and the terminal B (the outer peripheral section 21a of the first heating zone 21) should have a resistance value r13=0.68 ohms, a section between the terminal B and the measurement point P13 (the outer peripheral section 22a and the intermediate section 22b of the second heating zone 22) should have a resistance value r14=1.01 ohms, a section between the measurement points P13 and P14 (the inner peripheral section 22c and the intermediate section 22b of the second heating zone 22) should have a resistance value r15=0.97 ohms, and a section between the measurement point P14 and the terminal A (the outer peripheral section 22a of the second heating zone 22) should have a resistance value r15=0.68 ohms (each sectional resistance value r11 to r15 is a reference value after being adjusted).

Each sectional resistance value by design is shown in Table 1. It is so designed that the route A-B and the route B-A are in parallel and have the same resistance value (1.61 ohms), and the measurement sections in symmetric position in the respective routes (sections A-P11 and B-P14, sections P11-P12 and P13-P14, sections P12-B and P12-A) have the same resistance values. In the parallel patterns, there are two parallel routs at the respective measurement points, one starting from the terminal A and the other ending at the terminal A. Accordingly, by way of example, the resistance value at the section (A-P11) between the terminal A and the measurement point P11 is calculated by the equation 1/[1/r11+1/(r12+r13+r14+r15+r16)]=1/(1/1.26+1/5.18)=1.01 ohms (see FIG. 10(b).

TABLE 1

| Measurement Section | Resistance Value by Design |
| --- | --- |
| A-P11 | 1.26 (r11) |
| P11-P12 | 1.19 (r12) |
| P12-B | 0.77 (r13) |
| B-P13 | 1.26 (r14) |
| P13-P14 | 1.19 (r15) |
| P14-A | 0.77 (r16) |

As described above, the parallel pattern has two routes at the respective measurement points, one from the terminal A thereto and the other to the terminal A therefrom. Accordingly, contrary to the serial pattern, the resistance values at the respective measurement points do not consistent with the total sum. When a section is subjected to the resistance adjustment, the resistance value of other sections should also be changed, so that precise adjustment is extremely difficult. The adjustment is especially difficult when the section A-Pn and the section Pn-(B)-A forming the parallel routes have greatly different resistance values, which requires a skillful technique in machining the element.

Figure 11:
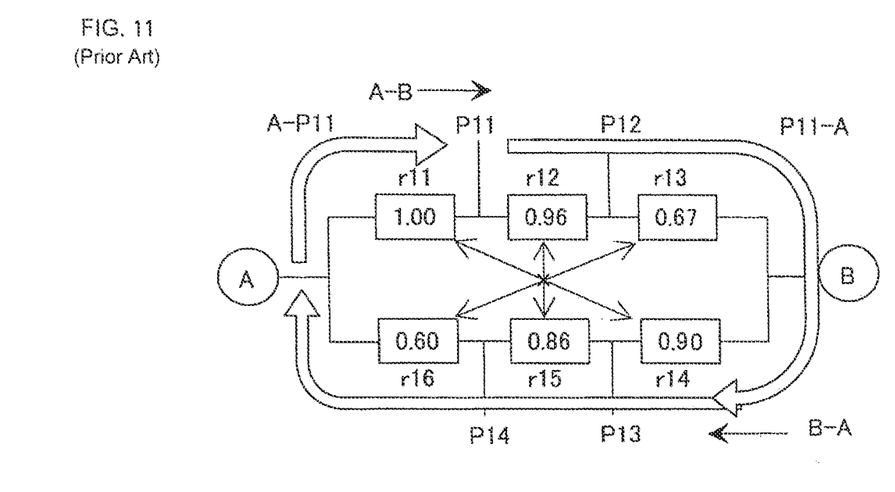
FIG. 11 is an explanatory view showing, by way of example, that it is difficult to conduct resistance adjustment for the conventional parallel-type heater of FIG. 8.

This will be described in more detail by giving a concrete example. It is practically difficult that the same thickness is given to the element forming the first and second heating zones 21, 22 of the conventional parallel-type heater 20 over the entire length, even with the controlled CVD conditions in the heater production. In most cases, the element has different thickness portion by portion. Due to this reason, the resistance values r11 to r16 measured at the respective measurement points P11, P12, B, P13 and P14 could become greatly different from the reference values shown in FIG. 10(b), which may actually be as shown in FIG. 11, for example. This example shows that, the element of the first and second heating zones 21, 22 of the conventional parallel-type heater 20 was formed to have almost the prescribed thickness in its upper area, so that the sectional resistance values r11, r12 and r13 in the upper areas are all almost equal to the reference values shown in FIG. 10(b), which would not require cutting or machining of the element for the resistance adjustment. However, the element was formed in its lower area somewhat thicker than the prescribed one, so that the sectional resistance values r14 to r16 in the lower areas are all lower than the reference values shown in FIG. 10(b) by the order of 0.8 to 1.1 ohms, which makes it necessary to scrape and make thinner the element in these areas, so as to adjust these sectional resistance values to become substantially equal to the respective reference values.

For example, the measured resistance value in the measurement section B-P13 is 0.90 ohms, which is lower than the resistance value r14=1.01 ohms shown in FIG. 10(b) for the same section, which requires the resistance adjustment by scraping the heater element. However, as known from the aforesaid equation, the resistance value in one section should be related with the resistance values in other sections, which means that if the sectional resistance value r14 should be changed, the resistance values in the preceding sections (any section originally having a resistance value nearly equal to the reference value requiring no resistance adjustment and/or any already resistance-adjusted sections). Accordingly, when the resistance adjustment is to be carried out for a particular section, it is necessary to scrape the element, while predicting its influence to change the resistance values in other sections together with an amount of such changes, and in consideration of an overall balance. This will require a skillful technique with many experiences.

PATENT DOCUMENTS

Patent Document 1: Japan Patent Publication No. 1999 (Hei11)-354260(A)

SUMMARY OF THE INVENTION

Problems to be Solved by the Invention

Accordingly, the problem to be solved by the present invention is to make it possible to easily perform pre-production resistance adjustment, with no need of a skill, for a heater having parallel heater patterns between terminals, while not detracting from intended function of the heater.

Means for Solving the Problems

According to claim 1 of the present invention, there is provided a parallel-type heater wherein a plurality of heater patterns are formed in parallel between a pair of terminals to which power supply bolts are fitted respectively, characterized in that each terminals is divided into a plurality of spaced segmental terminals of the same number as said heater patterns, said plural segmental terminals being electrically connected with each other by said power supply bolt, wherein a plurality of imaginary serial heater patterns are formed between one of said segmental terminals divided from one of said terminals and one of said segmental terminals divided from the other terminal when said power supply bolt are not yet fitted, whereas said plural imaginary serial heater patters are electrically connected with each other to form parallel circuits when said power supply bolts are fitted.

According to claim 2 of the present invention, in the parallel-type heater of claim 1, it is characterized in that a head of said power supply bolt is in contact with a heater element forming said heater pattern directly or via a washer made by conductive material.

According to claim 3 of the present invention, in the parallel-type heater of claim 1 or 2, it is characterized in that first and second heater patterns are formed in parallel between a pair of said terminals, each terminal being divided into a first segmental terminal to be electrically connected only with said first heater pattern and a second segmental terminal to be electrically connected only with said second heater pattern.

According to claim 4 of the present invention, in the parallel-type heater of claim 3, it is characterized in that each of said first and second segmental terminals is formed in substantially a semicircular ring shape, said first and second heater patterns being insulated with each other by a gap extending in a radial direction between said segmental terminals.

According to claim 5 of the present invention, in the parallel-type heater of claim 1 or 2, it is characterized in that first to fourth heater patterns are formed in parallel between a pair of said terminals, each terminal being divided into a first segmental terminal to be electrically connected only with said first heater pattern, a second segmental terminal to be electrically connected with said second heater pattern, a third segmental terminal to be electrically connected with said third heater pattern and a fourth segmental terminal to be electrically connected only with said fourth heater pattern.

According to claim 6 of the present invention, in the parallel-type heater of claim 5, it is characterized in that each of said first to fourth segmental terminals is formed in substantially a quadrant ring shape, said first to fourth heater patterns being insulated with each other by gaps extending in radial and circumferential directions between said segmental terminals.

According to claim 7 of the present invention, there is provided a production of the parallel-type heater of one of claims 1 to 6, characterized by steps of producing a heater body having a plurality of heater patterns in parallel between a pair of terminals, performing resistance adjustment for each of said imaginary serial heater patterns formed between one segmental terminal of one terminal and one segmental terminal of the other terminal before fitting said power supply bolts to said terminals, and then fitting said power supply bolts to said terminals so that said plural imaginary serial heater patterns become electrically connected with each other to form a parallel circuit.

Advantages of Invention

In accordance with the present invention, in a state where the power supply bolts are not yet fitted to the terminals, a plurality of imaginary serial heater patterns are formed between one of the segmental terminals divided from one terminal and one of the segmental terminals divided from the other terminal. Accordingly, it is possible to relatively easily perform the resistance adjustment for the imaginary serial heater patterns, in the same way as for the conventional serial-type heaters. Thereafter, the power supply bolts are fitted to the terminals so that the plural imaginary serial heater patterns become in contact with each other to form a parallel circuit, which means that the final product will be the same as the conventional parallel-type heaters. Thus, it is possible to stably and efficiently provide a product having a small individual difference.

DETAILED DESCRIPTION

The present invention will be described in detail in reference to some embodiments thereof.

Embodiment 1

Figure 1:
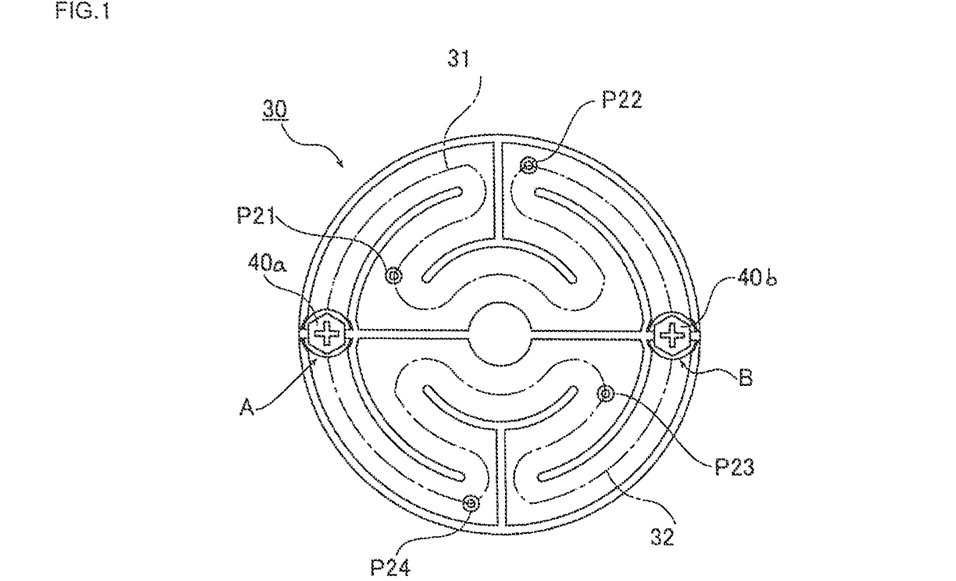
FIG. 1 is an overall plan view of a first parallel-type heater (in a complete state where the power supply bolts are fitted) according to an embodiment (Embodiment 1) of the present invention.
Figure 2:
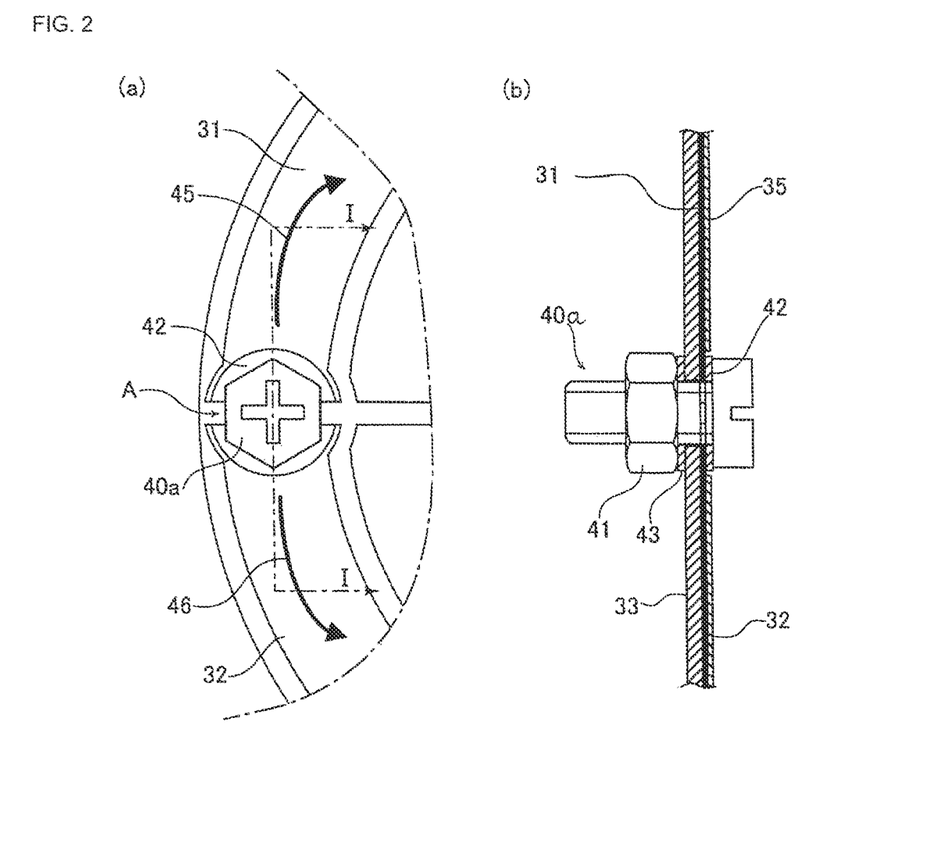
FIG. 2(a) is an enlarged plan view showing a part around the terminal of FIG. 1.
FIG. 2(b) is a cross-section taken along the section line I-I in (a).

FIG. 1 and FIG. 2 show a first parallel-type heater 30 according to one embodiment (Embodiment 1) of the present invention. In this first parallel-type heater 30, symmetrically designed first and second serial patterns 31, 32 are formed between terminals A, B.

This first parallel-type heater 30 comprises a heater body 36 of a triple-layered structure comprising a heater base having a disc-shape 33, at least its front and back surfaces being made from insulating material such as PBN (pyrolytic boron nitride, including one into which a small amount of carbon is incorporated), heater element 34 made from conductive material such as PG (pyrolytic graphite) forming the first and second serial patterns 31, 32 (their center lines being shown by dashed lines), and an overcoat 35 made from insulating material such as PBN. The heater body 36 may be manufactured by a routine procedure comprising the steps of vapor-depositing heater element 34 onto the heater base 33, partly removing the heater element to form the first and second serial patterns 31, 32, forming the overcoat 35 thereon, and then removing opposite end portions of the overcoat 35 to expose the heater element 34 to thereby form the terminals A, B. The overcoat 35 is shown in FIG. 2(b) but omitted in FIG. 1 and FIG. 2(a).

Terminal A is divided into a first electrode part 37A and a third electrode part 38A, whereas terminal B is divided into a second electrode part 37B and a fourth electrode part 38B. Each terminal A and B has a semicircular ring shape, and includes a power supply bolt 40a and 40b, respectively, inserted into a bolt hole 39 extending through the heater base 33, a nut 41 for fastening the power supply bolt 40a, 40b with the heater body 36 being interposed therebetween, and washers 42, 43. The first electrode part 37A and the second electrode part 37B are located at the opposite ends of the first serial pattern 31 so that they are electrically connected only with the first serial pattern 31, whereas the third electrode part 38A and the fourth electrode part 38B are located at opposite ends of the second serial pattern 32 so that they are electrically connected only with the second serial pattern 32. At terminal A, the first electrode part 37A and the third electrode part 38A are separated and insulated from each other by a first gap 44 extending in a radial direction, but once the power supply bolt 40a, 40b is fitted, they are connected with each other via a head of the power supply bolt 40 and the washer 42. Likewise, at terminal B, the second electrode part 37B and the fourth electrode part 38B are separated and insulated from each by the first gap 44, but once the power supply bolt 40a, 40b is fitted, they are connected with each other via the head and the washer 42. In this manner, first and second serial patterns 31, 32 become electrically connected with each other to form the first parallel-type heater 30. The power supply bolt 40a, 40b and the washer 42 are made from insulating material such as PBN. The washer 43 may be of insulating or non-insulating material.

Figure 3:
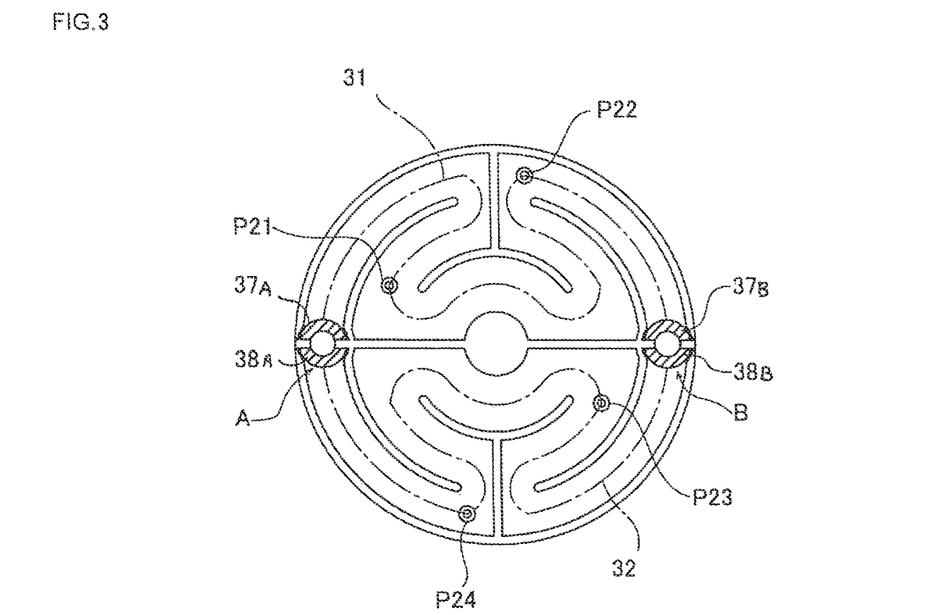
FIG. 3 is an overall plan view of the heater in a state where the power supply bolts are removed.
Figure 4:
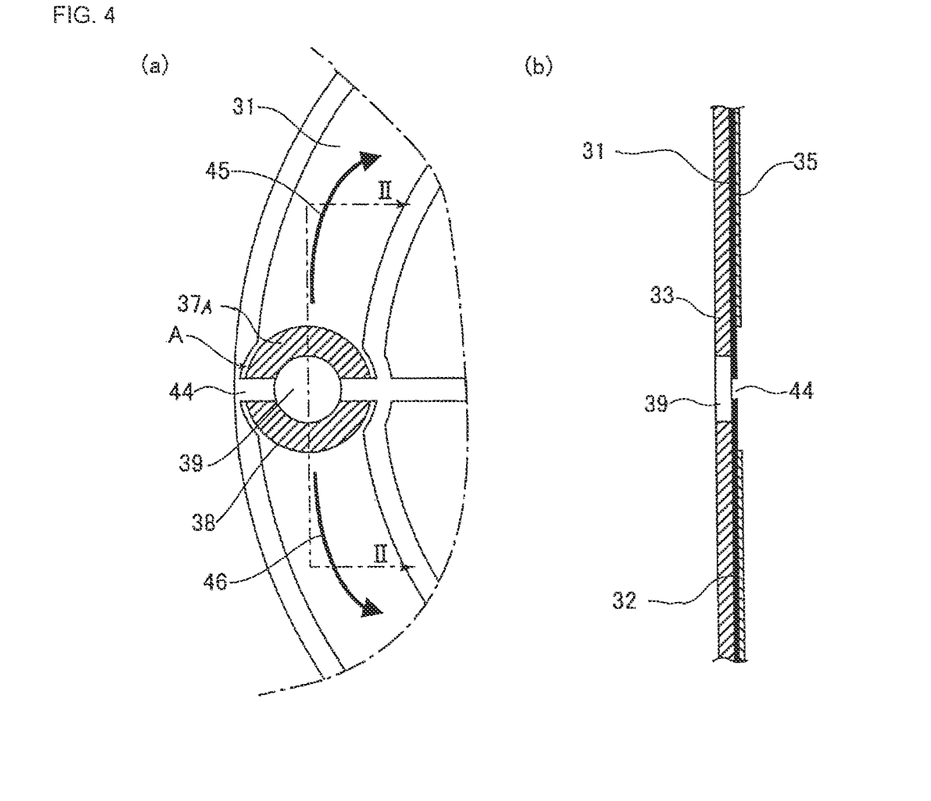
FIG. 4(a) is an enlarged plan view showing a part around the terminal of FIG. 3.
FIG. 4(b) is a cross-section taken along the section line II-II in (a).

FIG. 3 and FIG. 4 show the above-constructed first parallel-type heater 30 in a state where the power supply bolt 40a, 40b is removed (or a halfway state during production of the first parallel-type heater 30 where the heater body 36 has been obtained but the power supply bolt 40a, 40b is not yet fitted). As described before, in this state, the first electrode part 37A and the third electrode part 38A in terminal A, and the second electrode part 37B and the fourth electrode part 38B in terminal B, are insulated from each other by the first gap 44, so that the first serial pattern 31 is formed between the first electrode part 37A and the second electrode part 37B, and the second serial pattern 32 is formed between the third electrode part 38A and the fourth electrode part 38B, each forming a first imaginary serial route 45 and a second imaginary serial route 46. Accordingly, in this state, the resistance adjustment can be performed easily in the same way as for the aforementioned serial-type heaters 10 (FIG. 7).

Figure 5:
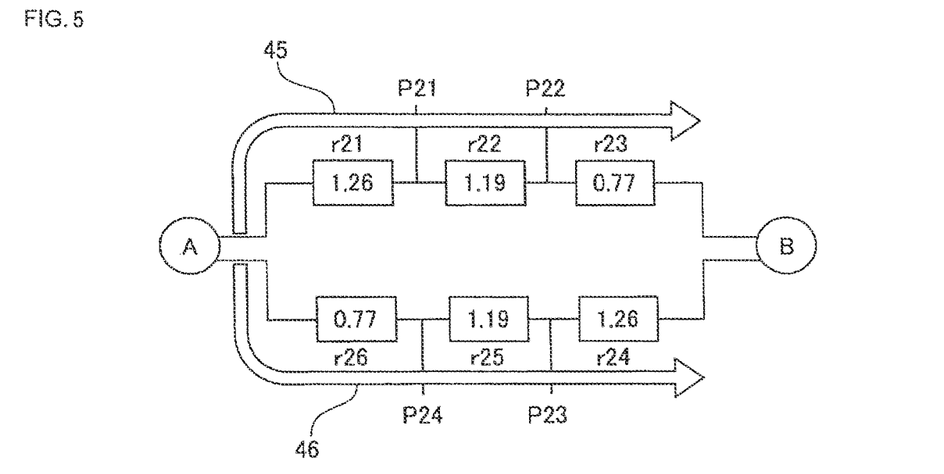
FIG. 5 is an explanatory view showing the manner of resistance adjustment for the heater of FIG. 3 and FIG. 4.

The measurement points P21 to P24 are plotted along the first and second serial patterns 31, 32 in the same way as in the aforementioned conventional parallel-type heater 20 (FIG. 8), and the resistance adjustment can be performed in the following manner, which will now be described in reference to FIG. 5. In this example, the resistance value of the first parallel-type heater 30 by design is 1.61 ohms (meaning that the resistance values of the first and second imaginary serial routes 45, 46 are both 3.22 ohms), wherein a section between the terminal A and the measurement point P21 should have a sectional resistance value r21=1.26 ohms, a section between the measurement points P21 and P22 should have a sectional resistance value r22=1.19 ohms, a section between the measurement point P22 and the terminal B should have a sectional resistance value r23=0.77 ohms, a section between the terminal B and the measurement point P23 should have a sectional resistance value r24=1.26 ohms, a section between the measurement points P23 and P24 should have a sectional resistance value r25=1.19 ohms, and a section between the measurement point P24 and the terminal A should have a sectional resistance value r25=0.77 ohms (each sectional resistance value r21 to r25 is a reference value after being adjusted).

In the state where the power supply bolt 40a, 40b is not yet fastened, the first imaginary serial route 45 is a serial route from the terminal A to the terminal B. Accordingly, in the same way as in the resistance adjustment for the serial-type heater 10 (FIG. 7) which has been described in reference to FIG. 9, it is possible to measure the resistance values between the terminal A and the measurement points P21, P22 and the terminal B and then adjust them sequentially to become equal to the respective reference values. Likewise, the resistance adjustment may be performed for the route 46 as well. Thus, the resistance adjustment may be carried out relatively easily. In practice, the element of the first and second serial patterns 31, 32 is formed at first a little bit thicker to provide a resistance value of a little bit smaller than the design resistance value, which should then be partly scraped depending upon the resistance values measured at the respective measurement points for the resistance adjustment.

After the resistance adjustment has been performed for the first and second imaginary serial routes 45, 46 in the above-described manner, the power supply bolt 40a, 40b, the nut 41 and the washers 42, 43 are fitted to each terminal A, B. Thus, as described before, the first and second serial patterns 31, 32 becomes electrically connected with each other to thereby form the first parallel-type heater 30.

Embodiment 2

The above-described first parallel-type heater 30 according to Embodiment 1 has first and second serial patterns 31, 32 in parallel between a pair of terminals A, B and therefore is designed such that each terminal A, B is divided into the first electrode part 37A and the third electrode part 38A (at terminal A), the second electrode part 37B and the fourth electrode part 38B (at terminal B) separated by the first radially-extending gap 44. However, in case where more definite temperature control is required for a larger heater, for example, it may be designed such that a greater number of heater patterns, for example four heater patterns are formed in parallel between a pair of terminals A, B.

Figure 6:
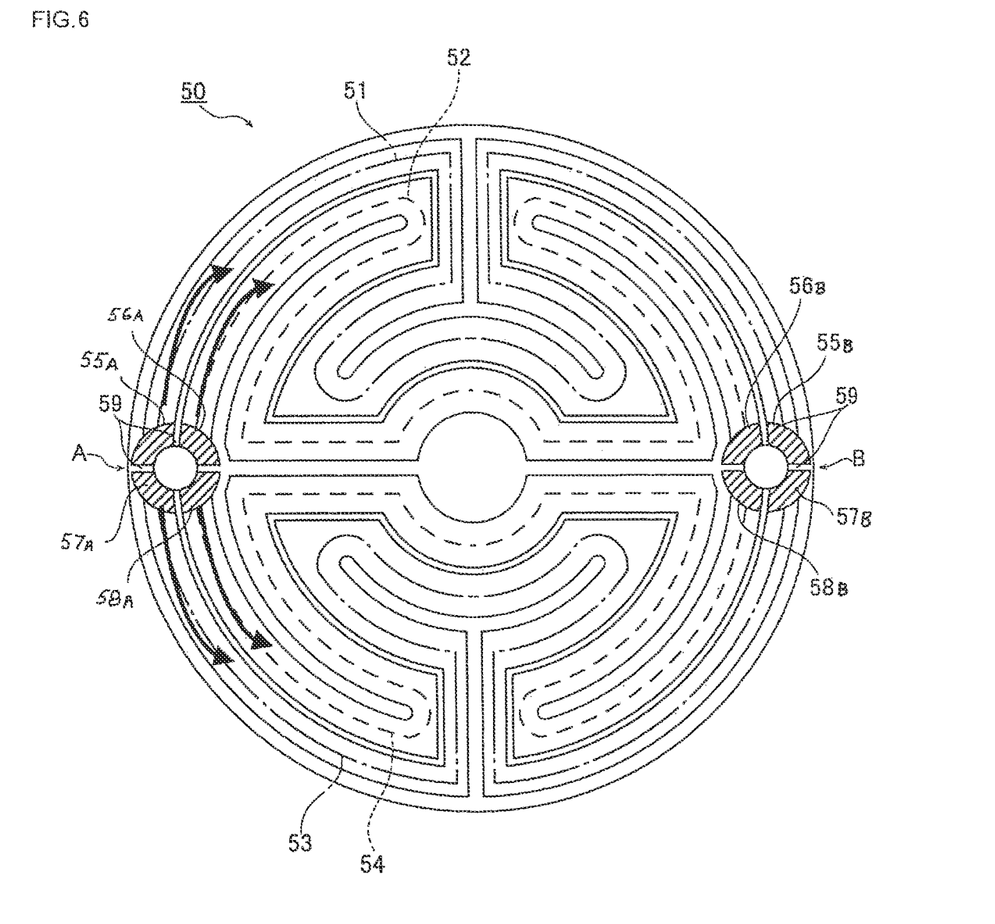
FIG. 6 is an overall plan view of a second parallel-type heater according to another embodiment (Embodiment 2) of the present invention, which is shown in a state where the power supply bolts are removed as in FIG. 3.

An example of such design is shown in FIG. 6. This second parallel-type heater 50 has $1^{st}$ serial pattern 51, $2^{nd}$ serial pattern 52, $3^{rd}$ serial pattern 53 and $4^{th}$ serial pattern 54 formed between terminals A, B, and each terminal A, B is divided into $1^{st}$ to $4^{th}$ electrode parts 55A-58A (at terminal A) and 55B-58B (at terminal B). The $1^{st}$ serial pattern 51 (its center line being shown by a dashed line) is formed between the $1^{st}$ electrode part 55A and 55B, the $2^{nd}$ serial pattern 52 (its center line being shown by a broken line) is formed between the $2^{nd}$ electrode parts 56A and 56B, the $3^{rd}$ serial pattern 53 (its center line being shown by a dashed line) is formed between $3^{rd}$ electrode parts 57A and 57B, and the $4^{th}$ serial pattern 54 (its center line being shown by a broken line) is formed between $4^{th}$ electrode parts 58A and 58B. Each segmental terminal 55A-58A, 55B-58B is formed in a quarter-circular ringed shape, which is separated from each other by gaps 59 extending in radial and peripheral directions.

Although the present invention has been described in detail in reference to the embodiments thereof, it is not limited thereto and may be implemented in various modified applications. For example, although the first and second serial patterns 31, 32 (the first and second imaginary serial routes 45, 46) become electrically connected with each other via the washer 42 when the power supply bolt 40a, 40b is fitted in Embodiment 1, it may also be designed that the bottom of the power supply bolt head 40a be in contact with the first and second serial patterns 31, 32 directly, which will require no washer 42. For a single heater having plural terminal pairs, each terminal of each pair is divided into a plural numbers of, for example, two (Embodiment 1) or four (Embodiment 2) electrode parts, the number thereof being corresponding to the number of the heater patterns formed in parallel between the terminals, so that imaginary serial patterns can be formed until the power supply bolts are fitted.

LEGENDS

10 serial-type heater
20 conventional parallel-type heater
30 parallel-type heater (embodiment of the present invention)
31, 32 first and second serial pattern
33 insulating substrate—heater base
34 conductive material—heater element
35 insulating layer—overcoat
36 heater body
37A $1^{st}$ electrode part—segmented terminal
37B $2^{nd}$ electrode part—segmented terminal
38A $3^{rd}$ electrode part—segmented terminal
38B $4^{th}$ electrode part—segmented terminal
39 bolt hole
40a, 40b power supply bolt
41 nut
42 washer
43 washer
44 first gap
45,46 first and second imaginary serial route
50 second parallel-type heater (embodiment of the present invention)
51-54 $1^{st}$ to $4^{th}$ serial pattern
55-58 $1^{st}$ to $4^{th}$ electrode part
59 second gap

What is claimed is:

1. A method for manufacturing a heater comprising:
    forming a conductive layer on an insulating substrate, the
        forming a conductive layer including a 1st serial pattern with a 1st electrode part at one end and a 2nd electrode part at an opposite end thereof, the 1st serial pattern having a 1st resistance value, and a 2nd serial pattern with a 3rd electrode part at one end and a 4th electrode part at an opposite end thereof, the 2nd serial pattern having a 2nd resistance value;
    forming a 1st terminal by connecting the 1st electrode part and the 3rd electrode with each other by a 1st bolt; and
    forming a 2nd terminal by connecting the 2nd electrode part and the 4th electrode part with each other by a 2nd bolt, wherein when connected by the 1st bolt and the 2nd bolt, the 1st serial pattern and the 2nd serial pattern are conducted with each other at the 1st and the 2nd terminals to form a parallel-type heater, wherein the 1st resistance value and the 2nd resistance value are separately adjusted prior to the formation of the parallel-type heater.

2. The method as claimed in claim 1, further comprising forming an insulating layer on the conductive layer.

3. The method as claimed in claim 2, wherein the insulating layer is a pyrolytic boron nitride (PBN) layer.

4. The method as claimed in claim 1, wherein the insulating substrate is a pyrolytic boron nitride (PBN) substrate.

5. The method as claimed in claim 1, wherein the conductive layer is made of pyrolytic graphite.

6. A method for manufacturing a heater comprising:
    forming a conductive layer including a 1st serial pattern with a 1st electrode part at one end and a 2nd electrode part at an opposite end, the 1st serial pattern having a 1st resistance value and a 2nd serial pattern with a 3rd electrode part at one end and a 4th electrode part at an opposite end thereof on an insulating substrate, the 2nd serial pattern having a 2nd resistance value;
    forming an insulating layer on the conductive layer;
    exposing the 1st electrode part, the 2nd electrode part, the 3rd electrode part and the 4th electrode part through the insulating layer;
    forming a 1st terminal by connecting the 1st electrode part and the 3rd electrode with each other by a 1st bolt; and
    forming a 2nd terminal by connecting the 2nd electrode part and the 4th electrode part with each other by a 2nd bolt, wherein when connected by the 1st bolt and the 2nd bolt, the 1st serial pattern and the 2nd serial pattern are conducted with each other at the 1st and the 2nd terminals to form a parallel-type heater, wherein the 1st resistance value and the 2nd resistance value are separately adjusted prior to the formation of the parallel-type heater.

7. The method as claimed in claim 6, wherein the insulating substrate is a pyrolytic boron nitride (PBN) substrate.

8. The method as claimed in claim 6, wherein the conductive layer is made of pyrolytic graphite.

9. The method as claimed in claim 6, wherein the insulating layer is a pyrolytic boron nitride (PBN) layer.

* * * * *